US006088237A

United States Patent [19]
Farnworth et al.

[11] Patent Number: 6,088,237
[45] Date of Patent: *Jul. 11, 2000

[54] SEMICONDUCTOR DEVICE SOCKET, ASSEMBLY AND METHODS

[75] Inventors: Warren M. Farnworth, Nampa; Larry D. Kinsman, Boise; Walter L. Moden, Meridian, all of Id.

[73] Assignee: Micron Technology, Inc., Boise, Id.

[*] Notice: This patent is subject to a terminal disclaimer.

[21] Appl. No.: 09/207,646

[22] Filed: Dec. 8, 1998

Related U.S. Application Data

[63] Continuation of application No. 09/001,300, Dec. 31, 1997.

[51] Int. Cl.[7] ............................................. H05K 7/10
[52] U.S. Cl. ..................... 361/796; 361/684; 361/686; 361/737; 361/785; 361/798; 361/801; 439/260; 439/267; 257/686; 257/723
[58] Field of Search ............................. 361/684, 686, 361/737, 740, 741, 756, 759, 767, 769, 783, 785, 787, 788, 796, 798, 801, 807–810; 257/678, 684, 685, 686, 723, 724; 324/538, 765, 754–758; 439/259, 260, 263, 264, 267, 268, 269.1, 338, 341

[56] References Cited

U.S. PATENT DOCUMENTS

| Re. 28,171 | 9/1974 | Anhalt | 439/261 |
|---|---|---|---|
| Re. 34,794 | 11/1994 | Farnworth | 257/678 |
| 3,475,717 | 10/1969 | Lane | 439/260 |
| 4,266,840 | 5/1981 | Seidler | 439/264 |
| 4,274,694 | 6/1981 | Leather | 439/267 |
| 4,314,736 | 2/1982 | Demnianiuk | 439/264 |
| 4,381,130 | 4/1983 | Sprenkle | 439/268 |
| 4,391,408 | 7/1983 | Hanlon et al. | 439/268 |
| 4,397,512 | 8/1983 | Barraire et al. | 439/296 |
| 4,501,461 | 2/1985 | Anhalt | 439/296 |
| 4,527,850 | 7/1985 | Carter | 439/330 |
| 4,560,216 | 12/1985 | Egawa | 439/41 |
| 4,710,134 | 12/1987 | Korsunsky | 439/264 |
| 4,720,156 | 1/1988 | Beers | 439/260 |
| 4,889,499 | 12/1989 | Sochor | 439/268 |
| 4,904,197 | 2/1990 | Cabourne | 439/260 |
| 5,358,421 | 10/1994 | Petersen | 439/266 |
| 5,380,213 | 1/1995 | Piorunneck et al. | 439/160 |
| 5,444,304 | 8/1995 | Hara et al. | 257/796 |
| 5,450,289 | 9/1995 | Kweon et al. | 361/773 |
| 5,451,815 | 9/1995 | Taniguchi et al. | 257/696 |
| 5,466,169 | 11/1995 | Lai | 439/264 |
| 5,592,019 | 1/1997 | Ueda et al. | 257/666 |
| 5,635,760 | 6/1997 | Ishikawa | 257/692 |

*Primary Examiner*—Leo P. Picard
*Assistant Examiner*—John B. Vigushin
*Attorney, Agent, or Firm*—Trask, Britt & Rossa

[57] ABSTRACT

A socket that secures bare and minimally packaged semiconductor devices substantially perpendicularly relative to a carrier substrate. The socket includes intermediate conductive elements and a member which moves the intermediate conductive elements between an insertion position and a biased position. After placement of the intermediate conductive elements into an insertion position, a semiconductor device may be inserted into a receptacle of the socket with minimal insertion force. Movement of the member to a biased position facilitates biasing of the intermediate conductive elements against a bond pad of the semiconductor device. The intermediate conductive elements establish an electrical connection between the semiconductor device and the carrier substrate. A first embodiment of the socket includes a member which moves transversely relative to the remainder of the socket. In a second embodiment of the socket, the member moves vertically relative to the socket body.

62 Claims, 10 Drawing Sheets

SEMICONDUCTOR DEVICE SOCKET, ASSEMBLY AND METHODS

CROSS REFERENCE TO RELATED APPLICATION

This application is a continuation of application Ser. No. 09/001,300, filed Dec. 31, 1997, pending.

BACKGROUND OF THE INVENTION

1. Field of the Invention

The present invention relates to zero insertion force sockets which receive and operatively connect one or more semiconductor devices to a carrier substrate. Particularly, the present invention relates to zero insertion force sockets which receive bare or minimally packaged, vertically mountable semiconductor devices. The present invention also relates to semiconductor devices which are mountable substantially perpendicular relative to a carrier substrate and to devices which secure bare or minimally packaged semiconductor devices to a carrier substrate.

2. Background of Related Art

Zero insertion force sockets which operatively attach packaged semiconductor devices to a carrier substrate are known in the art. Typical zero insertion force sockets include resilient contacts which bias against the leads of a package inserted therein. An electrical contact is established between each of the leads and its corresponding contact as the spring force of the contact biases the same against the lead. Exemplary zero insertion force sockets which include resilient contacts are disclosed in the following United States Patents: U.S. Pat. No. 5,466,169, issued to Kuang-Chih Lai on Nov. 14, 1995; U.S. Pat. No. 5,358,421, issued to Kurt H. Petersen on Oct. 25, 1994; U.S. Pat. No. 4,889,499, issued to Jerzy Sochor on Dec. 26, 1989; U.S. Pat. No. 4,710,134, issued to Iosif Korunsky on Dec. 1, 1987; U.S. Pat. No. 4,527,850, issued to Clyde T. Carter on Jul. 9, 1985; U.S. Pat. No. 4,381,130, issued to George J. Sprenkle on Apr. 26, 1983; and U.S. Pat. No. 4,266,840, issued to Jack Seidler on May 12, 1981.

Such devices would not be useful for securing and operatively attaching bare or minimally packaged semiconductor devices to a carrier substrate since the resilient contacts of some such devices are adapted to establish electrical contact with the elongated leads of a packaged semiconductor device, rather than with the bond pads of bare and many minimally packaged semiconductor devices. Other zero insertion force sockets in the prior art include resilient contacts which abut the semiconductor device during insertion of the same into the socket. Thus, the friction generated by the contacts of such zero insertion force sockets would likely scratch or otherwise damage bare semiconductor devices and many minimally packaged semiconductor devices during insertion therein.

Moreover, zero insertion force sockets which include resilient contacts are somewhat undesirable from the standpoint that the contacts tend to lose their resiliency over time and with frequent removal and reinsertion of devices. Thus, the ability of many such zero insertion force socket resilient contacts to establish adequate electrical connections with their corresponding leads of the inserted packaged semiconductor device diminishes over time. Moreover, such resilient contacts may also be damaged while inserting a packaged semiconductor device into the socket.

Other zero insertion force sockets have been developed in order to overcome the above-identified shortcomings of resilient contacts. Many such zero insertion force sockets include contacts which are biased against the leads of a packaged semiconductor device inserted therein by a laterally sliding mechanical actuation device. Examples of such devices are disclosed in the following United States Patents: U.S. Pat. No. Reissue 28,171, issued to John W. Anhalt; U.S. Pat. No. 4,501,461 on Sep. 24, 1974, issued to John W. Anhalt on Feb. 26, 1985; U.S. Pat. No. 4,397,512 issued to Michele Barraire et al. on Aug. 9, 1983; U.S. Pat. No. 4,391,408, issued to Richard J. Hanlon and Rudi O. H. Vetter on Jul. 5, 1983; and U.S. Pat. No. 4,314,736, issued to Eugene F. Demnianiuk on Feb. 9, 1982.

However, the contacts of many such devices are adapted to establish an electrical connection with the leads of a packaged semiconductor device rather than with the bond pads of a bare or minimally packaged semiconductor device.

Vertical surface mount packages are also known in the art. When compared with traditional, horizontally mountable semiconductor packages and horizontally oriented multichip packages, many vertical surface mount packages have a superior ability to transfer heat. Vertical surface mount packages also consume less area on a carrier substrate than a horizontally mounted package of the same size. Thus, many skilled individuals in the semiconductor industry are finding vertical surface mount packages more desirable than their traditional, horizontally mountable counterparts.

Exemplary vertical surface mount packages are disclosed in the following United States Patents: U.S. Pat. No. Re. 34,794 (the "'794 patent"), issued to Warren M. Farnworth on Nov. 22, 1994; U.S. Pat. No. 5,444,304 (the "'304 patent"), issued to Kouija Hara and Jun Tanabe on Aug. 22, 1995; U.S. Pat. No. 5,450,289, issued to Yooung D. Kweon and Min C. An on Sep. 12, 1995; U.S. Pat. No. 5,451,815, issued to Norio Taniguchi et al. on Sep. 19, 1995; U.S. Pat. No. 5,592,019, issued to Tetsuya Ueda et al. on Jan. 7, 1997; and U.S. Pat. No. 5,635,760, issued to Toru Ishikawa on Jun. 3, 1997.

The '794 patent discloses a vertical surface mount package having a gull-wing, zig-zag, in-line lead configuration and a mechanism for mounting the package to a printed circuit board (PCB) or other carrier substrate. The force with which the package mounts to the carrier substrate establishes a tight interference contact between the package's leads and their corresponding terminals on the carrier substrate.

The '304 patent describes a vertical surface mount package which has integrally formed fins radiating therefrom. The fins of that device facilitate the dissipation of heat away from the device. The semiconductor device is electrically connected to the package's leads by wire bonding. The leads of that vertical surface mount package, which extend therefrom in an in-line configuration, are mountable to the terminals of a carrier substrate by soldering.

However, many of the vertical surface mount packages in the prior art are somewhat undesirable from the standpoint that they permanently attach to a carrier substrate. Thus, those vertical surface mount packages are not readily user-upgradable. Moreover, many prior art vertical surface mount packages include relatively long leads, which tend to increase the impedance of the leads and reduce the overall speed of systems of which they are a part. Similarly, the wire bonding typically used in many vertical surface mount packages increases the impedance and reduces the overall speed of such devices. As the speed of operation of semiconductor devices increases, more heat is generated by the semiconductor device, requiring greater heat transfer. Similarly, as the speed of operation of semiconductor devices increases, decreasing the length of the leads regarding circuitry connecting the semiconductor device to other components, and; thereby, decreasing the impedance of the leads to increase the responsiveness of the semiconductor device, is important.

Thus, a need exists for a zero insertion force alignment device for bare or minimally packaged semiconductor devices which has low impedance and which facilitates the ready removal and reinstallation of the semiconductor devices relative to a carrier substrate. An alignment and attachment device which transfers heat away from the vertical surface mount package and establishes and maintains adequate electrical connections between a vertical surface mount package and a carrier substrate is also needed.

BRIEF SUMMARY OF THE INVENTION

The zero insertion force socket of the present invention addresses each of the foregoing needs. The zero insertion force socket includes intermediate conductive elements which are configured to establish an interference-type electrical connection with the bond pads of a bare or minimally packaged semiconductor device. An actuator moves a plate in the socket to bias the intermediate conductive elements against the bond pads of a semiconductor device without rubbing against the semiconductor device during insertion of the same into the socket.

In a first embodiment of the zero insertion force socket, the actuator moves the plate transversely relative to the socket body to move the intermediate conductive elements into and out of contact with the bond pads of a semiconductor device that is interconnected with the socket.

In a second embodiment of the zero insertion force socket, the actuator moves the plate vertically relative to the socket body in order to actuate movement of the intermediate conductive elements toward and away from the bond pads.

A semiconductor device which is useful in connection with the zero insertion force socket of the present invention includes all of its bond pads along a single edge thereof.

The present invention also includes a method of securing a semiconductor device substantially perpendicularly relative to a carrier substrate, and methods of designing and manufacturing vertically mountable bare semiconductor devices that are useful with the zero insertion force socket of the present invention. A computer with which the zero insertion force socket and the socket-semiconductor device assembly are associated is also within the scope of the present invention.

Advantages of the present invention will become apparent to those of ordinary skill in the relevant art through a consideration of the appended drawings and the ensuing description.

BRIEF DESCRIPTION OF THE SEVERAL VIEWS OF THE DRAWINGS

FIG. 6b is a cross-section taken along line 6b—6b of FIG. 6a;

DETAILED DESCRIPTION OF THE INVENTION

Figure 1:
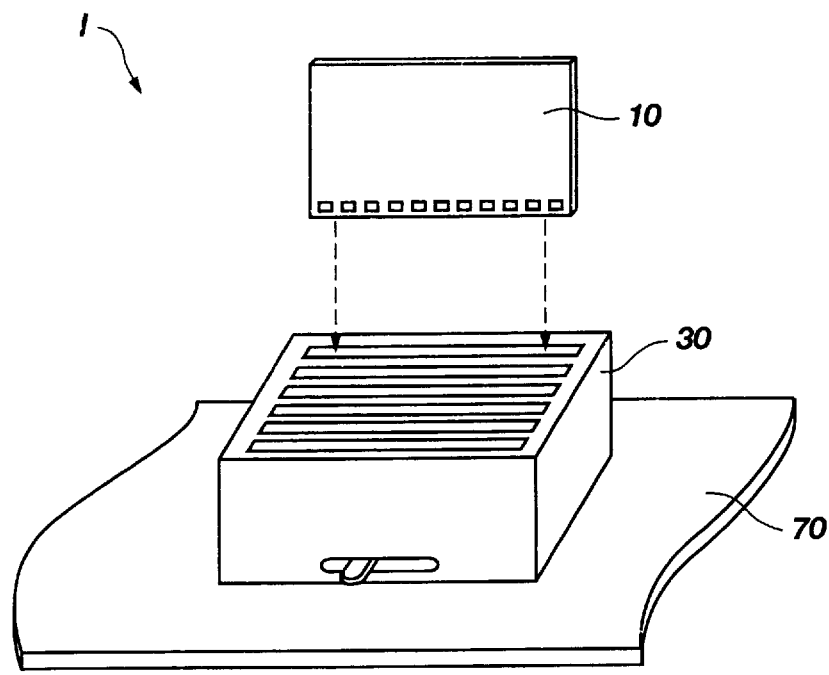
FIG. 1 is a perspective assembly view of a zero insertion force socket and semiconductor device assembly according to the present invention.

Referring to FIG. 1, an assembly 1 is shown which includes a vertically mountable semiconductor device 10 and a zero insertion force socket 30. The zero insertion force socket, which is also referred to as socket 30, is attachable to a carrier substrate 70, such as a printed circuit board (PCB). Semiconductor device 10 is insertable into socket 30, which is also referred to as a minimal insertion force socket, a reduced insertion force socket, and is frequently referred to as a zero insertion force socket, which orients the semiconductor device substantially perpendicularly relative to carrier substrate 70.

Figure 2:
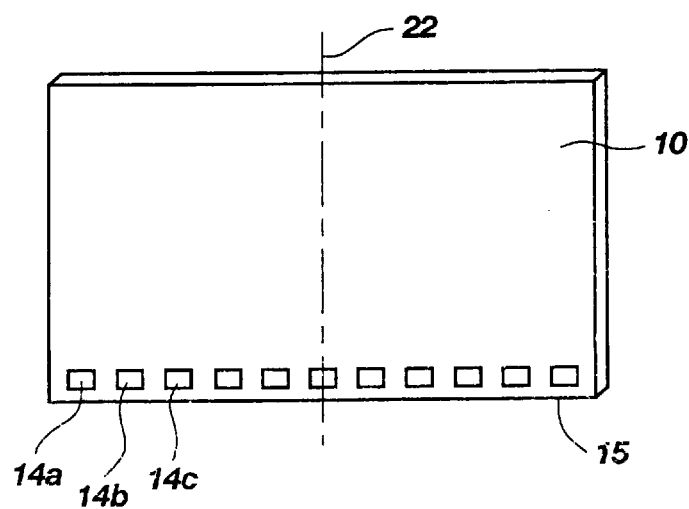
FIG. 2 is a frontal perspective view of a first embodiment of a vertically mountable semiconductor device that is useful in the assembly of FIG. 1.

With reference to FIG. 2, semiconductor device 10 is a semiconductor device of the type known in the industry, which includes circuit traces and active elements. The bond pads 14a, 14b, 14c, etc. of semiconductor device 10 are disposed on an active surface of the same, adjacent to a single edge 15 of the semiconductor device. Preferably, bond pads 14a, 14b, 14c, etc. are arranged in-line. Bond pads 14a, 14b, 14c, etc. may be disposed a short distance from edge 15, or their lower edges may be flush with the edge. Thus, during fabrication of semiconductor device 10, bond pads 14a, 14b, 14c, etc. are redirected to a location which is proximate edge 15. Processes which are known to those of ordinary skill in the art are useful for manufacturing semiconductor devices 10 which are useful in the assembly according to the present invention. Such processes include the formation of circuit traces which lead to edge 15 and the fabrication of bond pads 14a, 14b, 14c, etc. adjacent to edge 15. Preferably, the fabrication steps which precede the formation of the circuit traces that lead to bond pads 14a, 14b, 14c, etc. and the formation of the bond pads are unchanged from their equivalent steps in the fabrication of prior art semiconductor devices. Thus, existing semiconductor designs are useful in the assembly of the present invention with little or no modification.

A preferred semiconductor device 10 has a standardized number of bond pads 14a, 14b, 14c, etc., which are laterally spaced from one another at a standardized pitch, and which may be positioned at a specific location relative to a center line 22 of the semiconductor device, or relative to any other landmark on the semiconductor device, such as a side thereof. Alternatively, the number and pitch of bond pads 14a, 14b, 14c, etc. may be non-standardized. The placement of bond pads 14a, 14b, 14c, etc. proximate edge 15 imparts semiconductor device 10 with reduced impedance as the bond pads are electrically connected to carrier substrate 70, relative to many vertical surface mount packages and other packaged semiconductor devices in the prior art.

Figure 3:
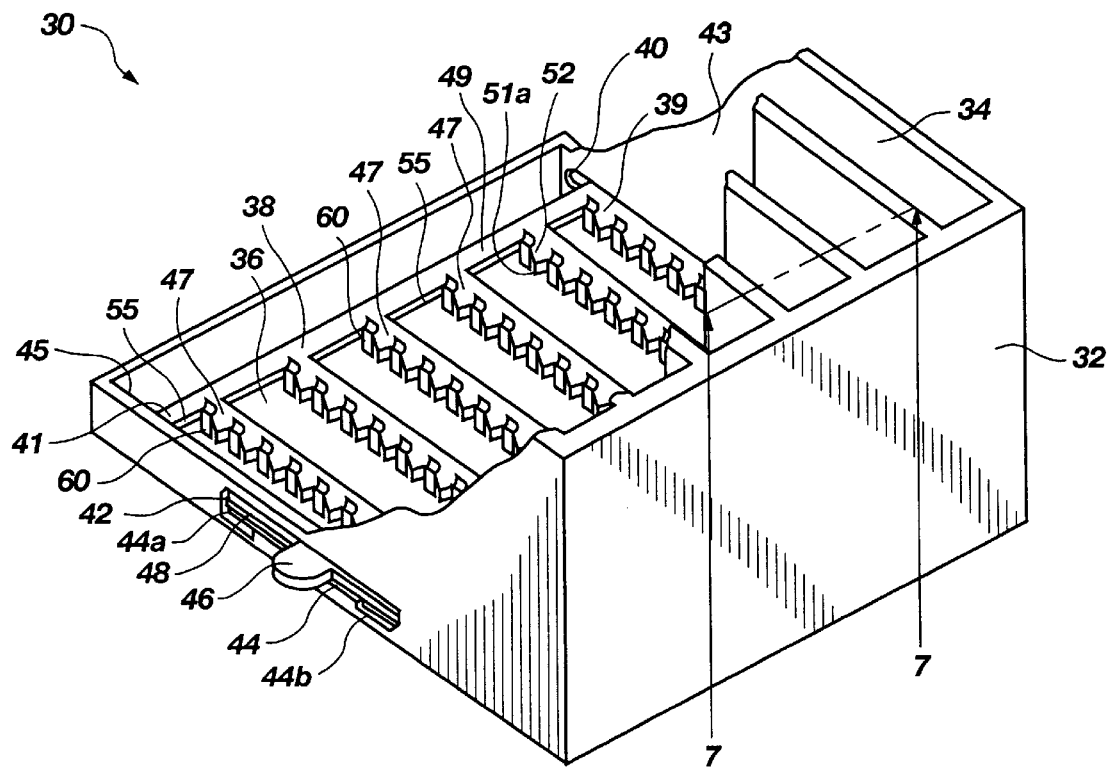
FIG. 3 is a partial perspective view of a first embodiment of a zero insertion force socket according to the present invention, illustrating a transversely moveable actuator and omitting upper portions of the socket.

FIG. 3 illustrates a first embodiment of socket 30, which includes a body 32 including one or more receptacles 34 formed through the top thereof, a base 36, a transverse plate 38, which is also referred to as a member, positioned over the base and substantially parallel thereto, and intermediate conductive elements 60 extending upwardly through base 36 and transverse plate 38.

Each receptacle 34 is an elongated opening that is defined by body 32 and extends downwardly into socket 30. Receptacles 34 are each configured to permit the insertion of a semiconductor device 10 (see FIG. 2) therethrough and align the same relative to carrier substrate 70 (see FIG. 1). Thus, in order to facilitate the insertion of a semiconductor device 10 into receptacle 34 and the proper alignment of the same relative to intermediate conductive elements 60, the dimensions of each receptacle are preferably slightly larger than the corresponding dimensions of the semiconductor device to be inserted therein.

With continued reference to FIG. 3, transverse plate 38 is disposed above base 36. Ends 39 and 41 of transverse plate 38 are disposed in slots 40 and 42, which are formed in surfaces 43 and 45, respectively, of body 32. Slots 40 and 42 engage ends 39 and 41, respectively, in a manner which facilitates lateral sliding of transverse plate 38 relative to body 32. An actuator element 46 extends from end 41 of transverse plate 38, and through an elongated slot 44 formed through body 32. Thus, movement of actuator element 46 along slot 44 slides transverse plate 38 relative to body 32. Slot 44 may also include member-position retention components 44a and 44b, which are referred to as retention components for simplicity, and which facilitate the retention of the position of transverse plate 38 relative to base 36.

Figure 4A:
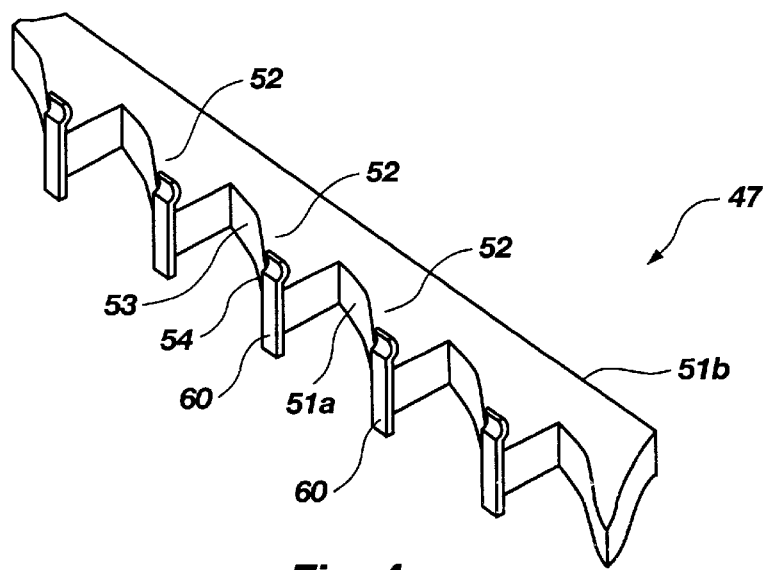
FIG. 4a is an enlarged partial perspective view depicting the association of the transversely moveable actuator of FIG. 3 with the intermediate conductive elements of the zero insertion force socket, which are shown in a biased position.
Figure 4B:
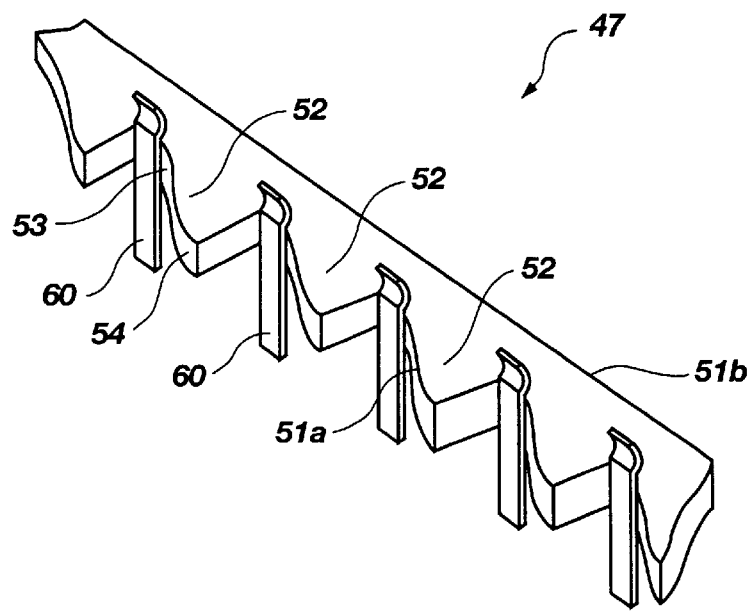
FIG. 4b is an enlarged partial perspective view depicting the association of the transversely moveable actuator of FIG. 3 with the intermediate conductive elements of the zero insertion force socket, which are shown in an insertion position.

Transverse plate 38 includes a series of mutually parallel members, which are referred to as arms 47, 48, that are joined by the sides 49 and 50 of the transverse plate 38. Each pair of adjacent arms 47 and 48 define a die slot 55 therebetween. With reference to FIGS. 4a and 4b, arms 47 each have a camming edge 51a, which includes a series of distinct teeth 52 extending therefrom, and an opposite edge 51b located opposite the camming edge. Each tooth 52 is tapered to define an insertion end 53 and a biasing end 54. Biasing end 54 is distanced further from opposite edge 51b than insertion end 53. Preferably, the number of teeth along each arm 47 corresponds to the number of intermediate conductive elements 60 extending adjacent thereto. Similarly, the length of teeth 52 along arm 47 corresponds to the spacing between the laterally adjacent intermediate conductive elements 60 which correspond thereto.

Figure 7:
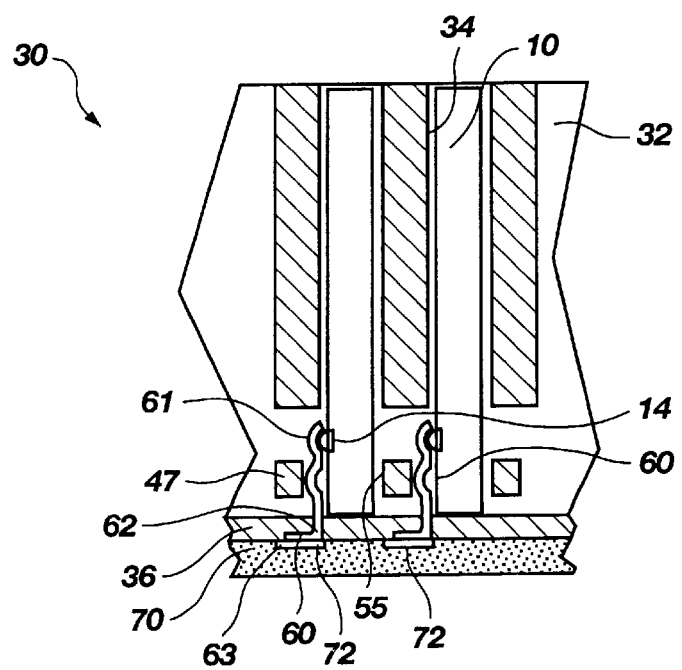
FIG. 7 is a cross-section taken along line 7—7 of FIG. 3, which depicts the zero insertion force socket and a semiconductor device interconnected therewith.

As illustrated by FIG. 7, intermediate conductive elements 60 extend through base 36, into socket 30, and upward through die slot 55. Each intermediate conductive element 60 is adjacent an arm 47 and proximate thereto. Each intermediate conductive element 60 is a resilient leaf spring which includes a bond pad contact end 61 that faces away from the corresponding arm 47, a segment 62 that is fixedly retained by base 36, and a terminal contact end 63 adjacent segment 62 and exposed through the bottom of the base. As illustrated, bond pad contact end 61 is configured to establish an electrical connection with a bumped bond pad. Terminal contact end 63 is electrically connected to a corresponding terminal 72 on carrier substrate 70. Each intermediate conductive element 60 is formed from a resilient, electrically conductive material, such as copper, nickel, or palladium. Preferably, each intermediate conductive element 60 has a length of about 1½ mm or less. More preferably, each intermediate conductive element 60 has a length of about 1 mm or less. As those in the art are aware, longer, larger wires create greater impedance. Thus, less impedance is generated by shorter intermediate conductive elements 60. The total length of each intermediate conductive element 60 depends on the thickness of the base of socket 30, the length required to establish an electrical connection with a terminal on the carrier substrate, and the length required to establish and electrical connection with the bond pads of the semiconductor device.

Turning now to FIG. 4a, the relationship between intermediate conductive element 60 and arm 47 is shown. Camming edge 51a of arm 47 is biased against intermediate conductive element 60. Specifically, each intermediate conductive element 60 abuts a corresponding tooth 52. Since segment 62 (see FIG. 7) of each intermediate conductive element 60 is fixedly disposed within base 36 (see FIG. 7), as arm 47 is moved laterally along slots 40 and 42 (see FIG. 3), movement of each intermediate conductive element 60 along its corresponding tooth 52 facilitates movement of the top end of the respective intermediate conductive element 60, which is referred to as a bond pad contact end 61, in a direction that is substantially transverse to the movement of arm 47. Bond pad contact end 61 faces away from its corresponding arm 47. As depicted in FIG. 4a, arm 47 is in a biased position, wherein intermediate conductive element 60 is positioned adjacent to biasing end 54 of tooth 52, which moves the intermediate conductive element away from opposite edge 51b. Thus, intermediate conductive element 60 has been forced outward relative to arm 47.

FIG. 4b shows arm 47 in an insertion position, wherein intermediate conductive element 60 is positioned adjacent to insertion end 53 of tooth 52, which permits the intermediate conductive element to move back toward opposite edge 51b. Therefore, bond pad contact end 61 of intermediate conductive element 60 may move into a die insertion position (i.e, a position which facilitates the insertion of a semiconductor device 10 into socket 30).

Figure 5:
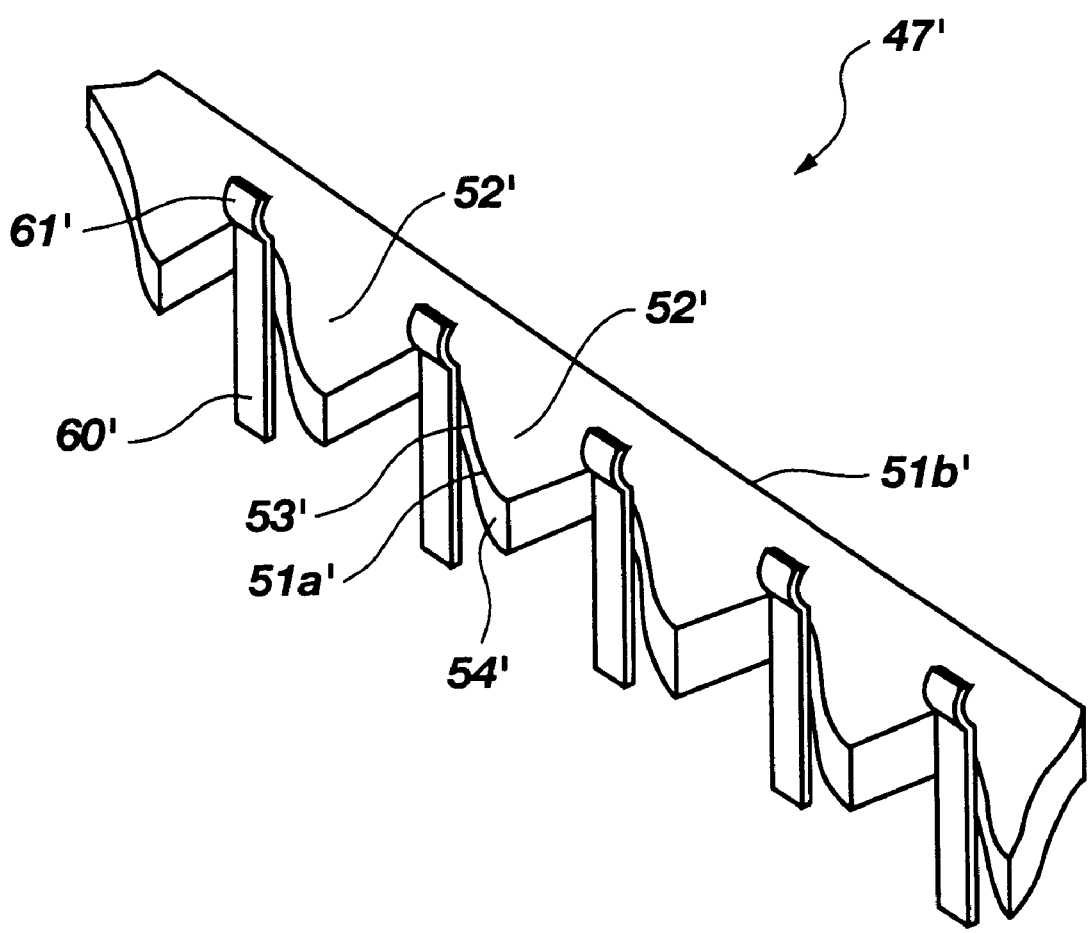
FIG. 5 is an enlarged partial perspective view depicting a variation of the transverse plate and intermediate conductive elements.

Turning now to FIG. 5, a variation of the present embodiment of the zero insertion force socket is shown, wherein each of the elements is substantially the same, with the following exceptions. Intermediate conductive elements 60' are leaf springs which each include a bond pad contact end 61' that faces toward arm 47'. Each arm 47' includes teeth 52' on a camming edge 51a' thereof, and an opposite edge 51b' which is located opposite the camming edge. Each of teeth 52' is tapered to define a biasing end 53' and an insertion end 54'. Insertion end 54' of each tooth 52' is distanced further from opposite edge 51b' than biasing end 53'. Arm 47' is also configured to support a semiconductor device 10 (see FIG. 2). Thus, as intermediate conductive element 60' moves along tooth 52' from insertion end 54' to biasing end 53', bond pad contact end 61' moves toward opposite edge 51b' and toward a semiconductor device 10 supported by arm 47'.

Figure 6A:
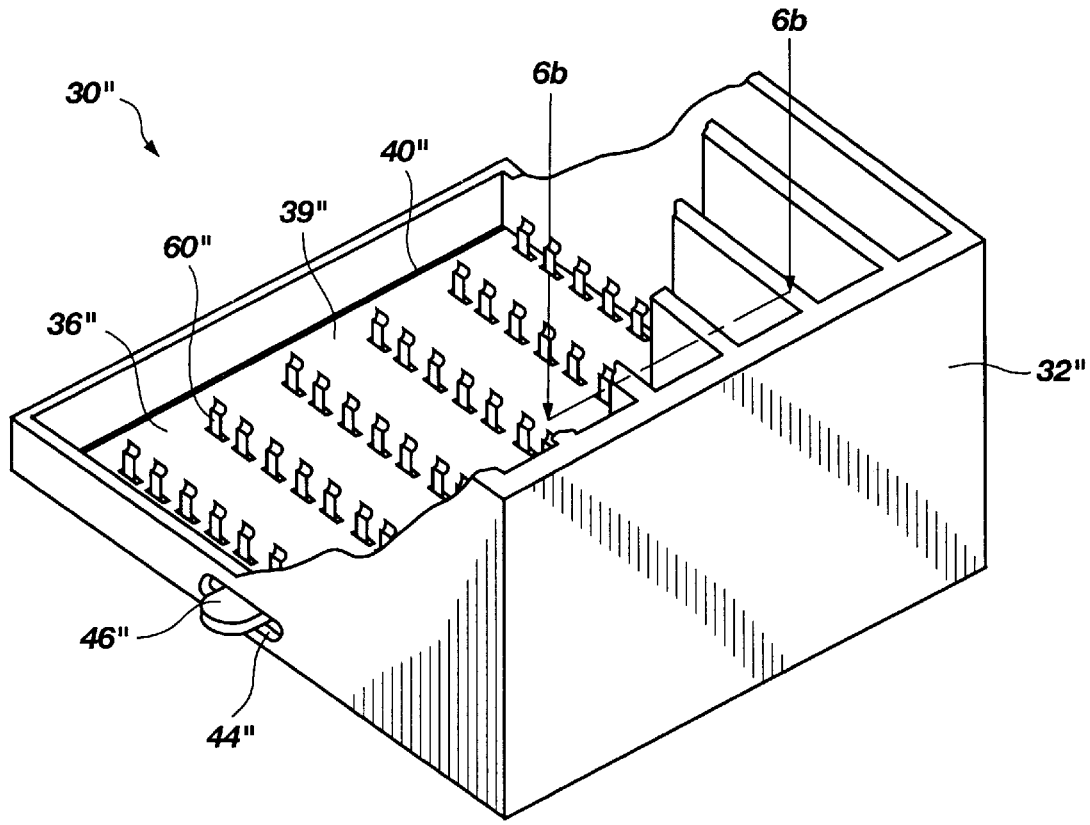
FIG. 6a is a partial perspective view depicting another variation of the transverse plate and intermediate conductive elements.
Figure 6B:
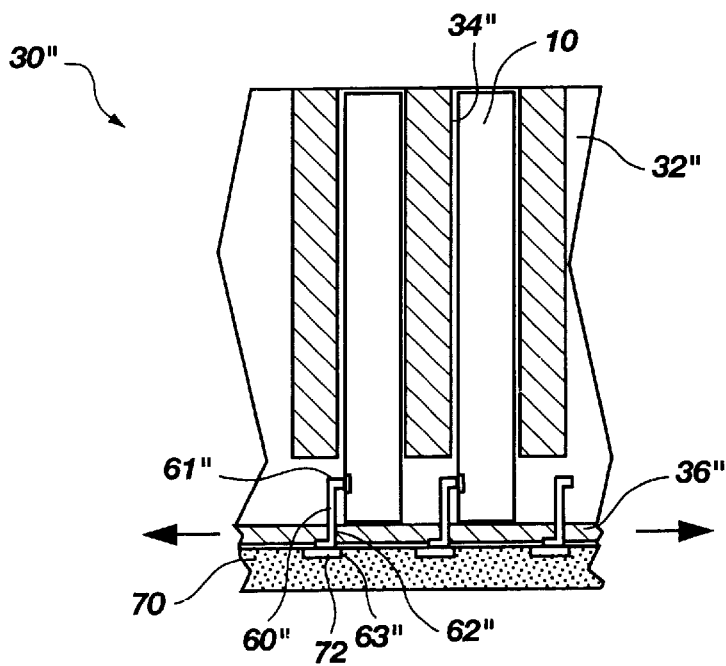

FIGS. 6a and 6b depict another variation of the first embodiment of the zero insertion force socket 30", wherein the base 36" of the socket, which is also referred to as a member, acts as the transverse plate, and is therefore moveable transversely relative to the remainder of the socket. Ends 39" and 41" of base 36" are disposed within slots 40" and 42", respectively, that are formed in opposite sides of body 32" and which facilitate the transverse movement of base 36" relative to body 32". The arrows of FIG. 6b illustrate the directions that base 36" moves relative to body 32". Actuator element 46", which effects the movement of base 36" along slots 40" and 42", extends from base 36" and through a slot 44" formed through body 32". Intermediate conductive elements 60" each include a terminal contact end 63", which establishes an interference-type electrical contact with a corresponding terminal 72 of carrier substrate 70, a segment 62" that is fixedly retained by base 36", and a bond pad contact end 61". During transverse movement of base 36" relative to socket 30", the terminal contact end 63" of each intermediate conductive element 60" slides along its respective terminal 72 to maintain its electrical contact therewith, and each bond pad contact end 61" moves relative to its corresponding bond pad 14 of a semiconductor device 10 inserted into the socket 30". Thus, each bond pad contact end 61" may be oriented in either a biased position, whereby it abuts and establishes an interference-type electrical contact with its corresponding bond pad 14, or an insertion position, whereby it is moved outward to facilitate insertion or removal of a semiconductor die 10 from socket 30".

With reference to FIG. 1, socket 30 (as well as sockets 30' and 30" of FIGS. 5, 6a and 6b) is manufactured from a material which maintains its shape and rigidity at the relatively high temperatures that are generated during the operation of a semiconductor device. A socket material which has good thermal conductivity properties and which may be formed into thin layers is also preferable. Materials including, without limitation, copper, aluminum, ceramic, glass, FR-4 board, and injection molded plastics are useful for manufacturing socket 30.

Referring again to FIG. 7, as an example of the use of socket 30, actuator element 46 is positioned along slot 44 such that transverse plate 38, and therefore each intermediate conductive element 60, is moved into an insertion position. A semiconductor device 10 is then inserted into receptacle 34 and through die insertion slot 55, so that it rests upon base 36. Actuator element 46 is then positioned in slot 44 to move transverse plate 38 and each intermediate conductive element 60 to a biased position against its corresponding bond pad 14, which establishes an electrical connection between the bond pad 14 and its respective terminal 72 of carrier substrate 70.

Figure 8:
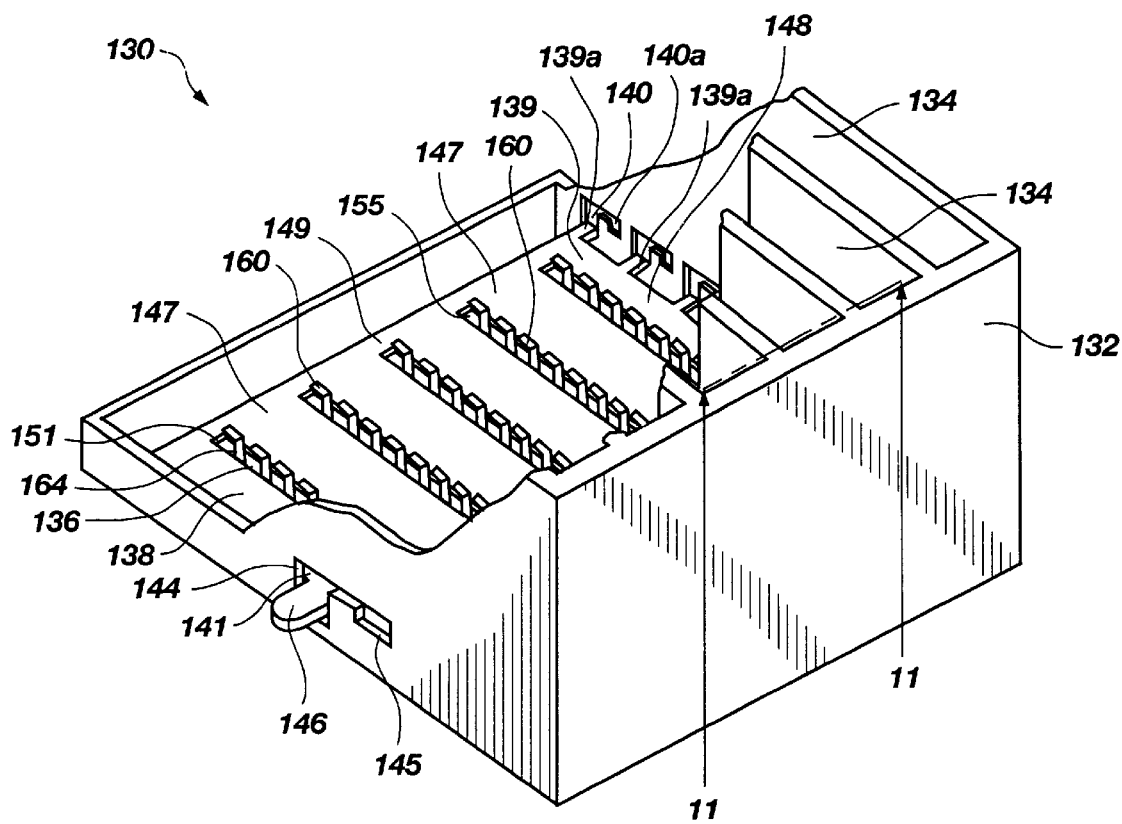
FIG. 8 is a partial perspective view of a second embodiment of a zero insertion force socket according to the present invention, illustrating a vertically moveable plate and omitting upper portions of the socket.

With reference to FIG. 8, a second embodiment of a zero insertion force socket is shown, which is referred to as socket 130. Socket 130 includes a body 132, one or more receptacles 134 formed into the top of the body, a base 136, an ejector plate 138, which is also referred to as a member, disposed within the body above the base, and intermediate conductive elements 160 extending upwardly through base 136 and ejector plate 138.

Each receptacle 134 is an elongated opening that extends downwardly into body 132. Each receptacle 134 is configured to receive a semiconductor device 10 (see FIG. 2) and align the same relative to a carrier substrate 70 (see FIG. 1). Therefore, the dimensions of receptacle 134 are slightly larger than the corresponding dimensions of semiconductor device 10 so as to facilitate the insertion of the semiconductor device thereinto and the proper alignment of the same with respect to carrier substrate 70.

Still referring to FIG. 8, ejector plate 138 includes two ends 139 and 141 that each include a plurality of fingers 139a and 141a (not shown), respectively, extending therefrom. Fingers 139a and 141a are disposed within vertical guide slots 140 and 142 (not shown), respectively, that are formed in body 132. Slots 140 and 142 engage fingers 139a and 141a in a manner which facilitates vertical sliding of ejector plate 138 relative to body 132. An actuator element 146 extends from end 141 of ejector plate 138, and through an elongated vertical slot 144 that is formed through body 132. Thus, movement of actuator element 146 along slot 144 slides ejector plate 138 vertically relative to body 132. Slots 140, 142, and 144 each include a member-position retention component 140a, 142a (not shown), and 145, respectively, which are each referred to as a retention component for simplicity, and each of which are configured to retain ejector plate 138 in an upper, insertion position. As illustrated, actuator element 146, fingers 139a, 141a and ejector plate 138 must be moved laterally relative to body 132 to retain the actuator element in retention component 145, the fingers in retention components 140a, 142a, respectively, and the ejector plate in the insertion position.

Ejector plate 138 includes a plurality of mutually parallel members, which are referred to as arms 147, 148, that are joined by the sides 149 and 150 (not shown) of the ejector plate. Arms 147 are each configured to support a semiconductor device 10 (see FIG. 11) disposed thereon. Alternatively, semiconductor device 10 may extend through an elongated slot 155, defined by a pair of adjacent arms 147 or 147, 148 and rest upon base 136. Intermediate conductive elements 160 extend upward through elongated slot 155. Each arm 147 includes a camming edge 151, which abuts a camming section 164 of each of the corresponding intermediate conductive elements 160.

Figure 9:
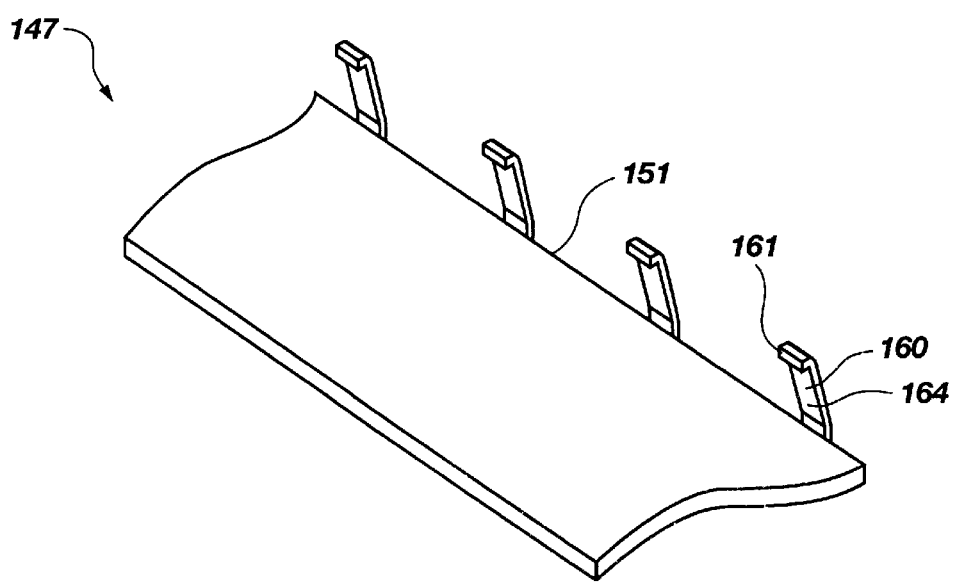
FIG. 9 is an enlarged partial perspective view depicting the association of the vertically moveable actuator of FIG. 8 with the intermediate conductive elements of the zero insertion force socket.
Figure 10:
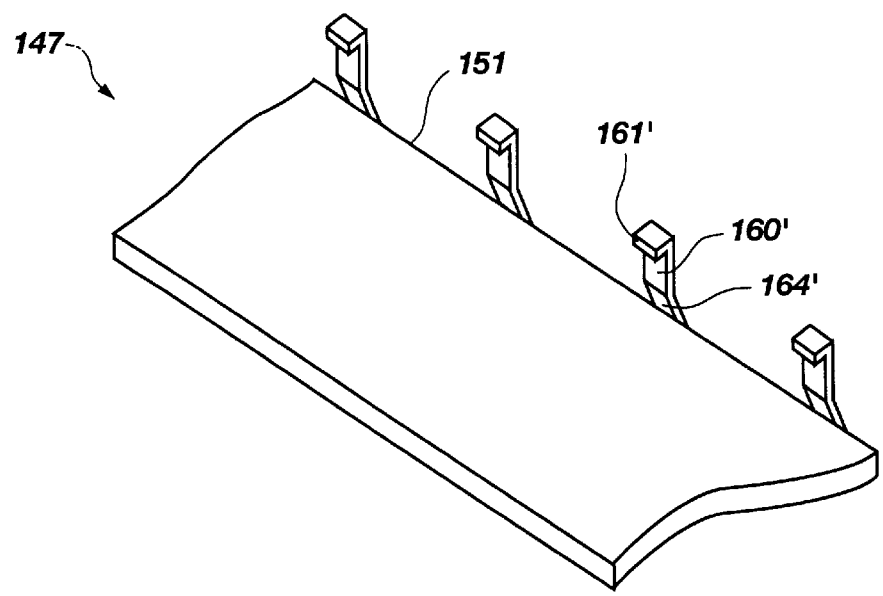
FIG. 10 is an enlarged partial perspective view depicting a variation of the intermediate conductive elements of FIG. 8.
Figure 11:
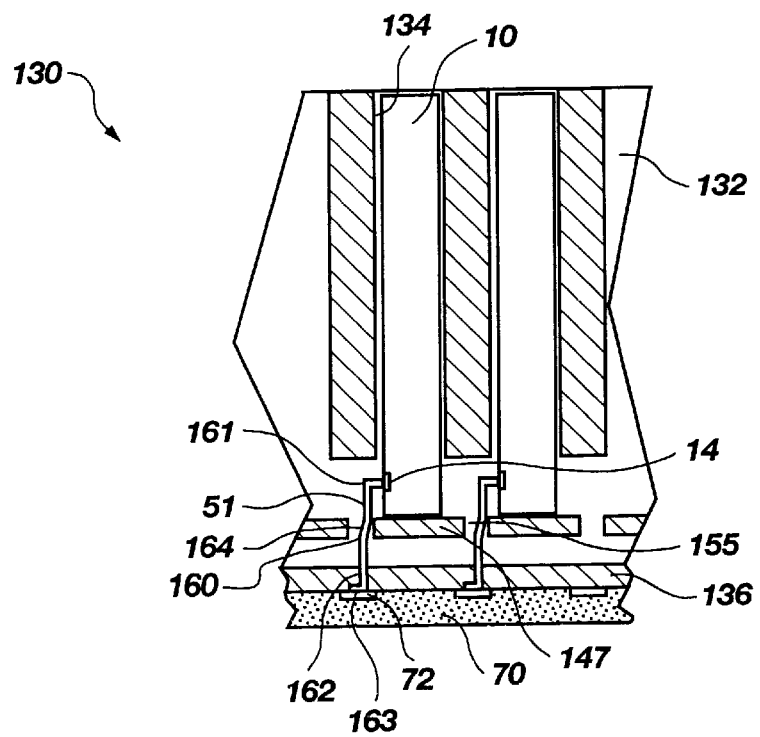
FIG. 11 is a cross-section taken along line 11—11 of FIG. 8, which depicts the zero insertion force socket and a semiconductor device interconnected therewith.

Referring now to FIG. 11, intermediate conductive element 160 is a leaf spring which includes a bond pad contact end 161 at the top thereof and adjacent a camming section 164, which is located above a segment 162 thereof that is fixedly retained within base 136. Intermediate conductive element 160 also includes a terminal contact end 163 that extends from segment 162 and is exposed through the bottom of base 136. Terminal contact end 163 is electrically connected to a corresponding terminal 72 on carrier substrate 70. FIG. 9 illustrates an intermediate conductive element 160 which has a substantially flat camming section 164 that extends diagonally toward its corresponding arm 147. Bond pad contact end 161 also extends toward the arm 147 that corresponds to intermediate conductive element 160. FIG. 10 illustrates a variation of the intermediate conductive element 160', which includes a camming section 164' that is concavely curved relative to the corresponding arm 147. Thus, camming section 164' extends upwardly toward arm 147. Bond pad contact end 161' also extends toward arm 147. Preferably, each intermediate conductive element 160, 160' has a length of about 1½ mm or less. More preferably, each intermediate conductive element 160, 160' has a length of about 1 mm or less.

With continued reference to FIGS. 9 and 10, as ejector plate 138 (see FIG. 8) is moved upward relative to body 132 (see FIG. 8), camming edge 151 slides upward along the camming section 164, 164' of intermediate conductive element 160, 160', biasing against the camming section and forcing the bond pad contact end 161, 161' away from arm 147. Thus, upward movement of ejector plate 138 places intermediate conductive element 160, 160' into an insertion position. Similarly, as ejector plate 138 is positioned downward relative to body 132, camming edge 151 of arm 147 slides downward along camming section 164, 164', permitting the camming section to resiliently spring back to facilitate the movement of bond pad contact end 161, 161' toward arm 147 and into electrical contact with a corresponding bond pad 14 (see FIG. 2) of a semiconductor device 10 (see FIG. 2) supported by arm 147. Thus, lowering of ejector plate 138 permits intermediate conductive elements 160, 160' to resiliently return to a biasing position.

Figure 12:
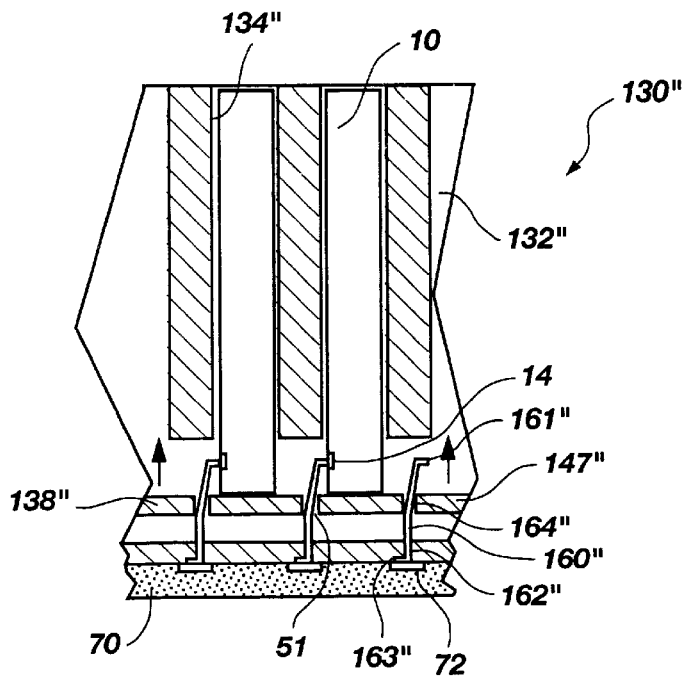
FIG. 12 is a cross-sectional view of a variation of the second embodiment of the zero insertion force socket.

With reference to FIG. 12, a variation of the second embodiment of the zero insertion force socket 130" is depicted with the transverse plate 138" and intermediate conductive elements 160" in a biased position, wherein each of the elements are substantially the same, with the following exceptions. Intermediate conductive elements 160" are leaf springs which each include a camming section 164" and a bond pad contact end 161", each of which extend away from arm 147". Camming edge 151" abuts camming section 164" and is positionable vertically relative thereto. As camming edge 151" is moved upward along camming section 164", bond pad contact end 161" is biased away from arm 147" and toward a semiconductor device 10 disposed on the adjacent arm 147". Upon movement of ejector plate 138" into an upper, biased position, bond pad contact end 161" abuts its corresponding bond pad 14 to establish an interference-type electrical contact therewith. The arrows illustrate the direction of movement of transverse plate 138" to an insertion position to facilitate placement of the intermediate conductive elements 160" into an insertion position.

Figure 13:
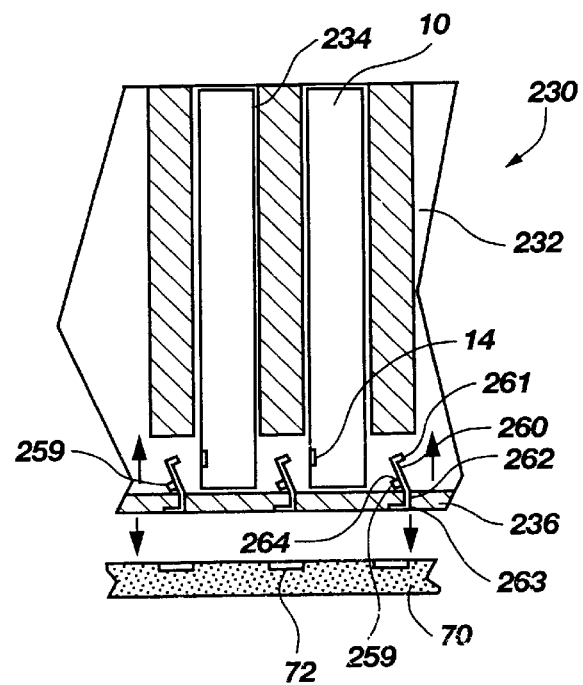
FIG. 13 is a cross-sectional view of another variation of the second embodiment of the zero insertion force socket.

FIG. 13 illustrates another variation of the second embodiment of zero insertion force socket 230 with the base 236 and the intermediate conductive elements 260 in an insertion position, wherein the base 236 of the socket, which is also referred to as a member, also serves as the ejector plate, and is therefore moveable vertically relative to body 232. The arrows illustrate the direction in which base 236 moves to place it and the intermediate conductive elements 260 into a biased position. Intermediate conductive elements 260 extend through base 236 and upwardly therefrom. Each intermediate conductive element 260 includes a terminal contact end 263 which establishes an interference-type electrical contact with a corresponding terminal 72 of carrier substrate 70, a segment 262 that is fixedly retained by base 236, a camming section 264, and a bond pad contact end 261.

Socket 230 also includes one or more bias components 259 that extend transversely across body 232. Each bias component 259 is positioned above base 236 and abuts the camming sections 264 of each group of intermediate conductive elements 260. The camming sections 264 are resiliently biased against bias component 259. Bond pad contact end 261 extends away from bias component 259 and camming section 264 extends upwardly toward bias component 259. As base 236 is moved upward, into an insertion position, relative to body 232 and bias component 259, intermediate conductive elements 260 spring back toward their corresponding bias component 259 and away from a semiconductor device adjacent thereto. Thus, as base 236 is moved downward relative to body 232 and bias component 259 (i.e., into a biased position), the bias component forces bond pad contact end 261 away from the same and toward a semiconductor device 10 adjacent thereto. Upon lowering of base 236 to a biased position, the terminal contact end 263 of intermediate conductive element 260 contacts its corresponding terminal 72 to establish an electrically conductive connection therewith. Thus, as base 236 is moved into the biased position, an electrical connection is created between each terminal 72 and a corresponding bond pad 14 of a semiconductor device 10 disposed within socket 230.

With reference again to FIG. 8, socket 130 (as well as sockets 130" and 230 of FIGS. 12 and 13) is manufactured from a material which maintains its shape and rigidity at the relatively high temperatures that are generated during the operation of a semiconductor device. A socket material which has good thermal conductivity properties and which may be formed into thin layers is also preferable. Materials including, without limitation, copper, aluminum, ceramic, glass, FR-4 board, and injection molded plastics are useful for manufacturing socket 130.

Referring again to FIG. 11, as an example of the use of socket 130, actuator element 146 is positioned upward along slot 144 such that ejector plate 138, and therefore intermediate conductive elements 160, are moved into an insertion position. A semiconductor device 10 is then inserted into receptacle 134 so that it rests upon an arm 147 of ejector plate 138. Actuator element 146 is moved in slot 144 to place ejector plate 138 into a lowered, biased position. Thus, intermediate conductive elements 160 are also moved into a biased position to establish an electrical connection between bond pads 14 of semiconductor device 10 and their respective terminals 72 of carrier substrate 70. Subsequent placement of ejector plate 138 in an insertion position ejects at least a portion of each semiconductor device 10 from its corresponding receptacle 134.

Figure 14A:
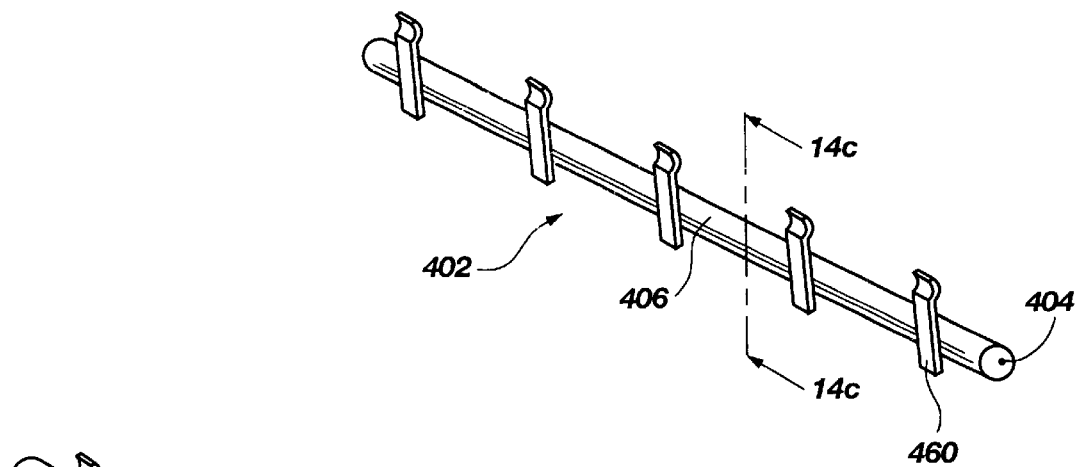
FIGS. 14a and 14b are enlarged partial perspective views depicting another variation of the transverse plate and intermediate conductive elements.
Figure 14B:
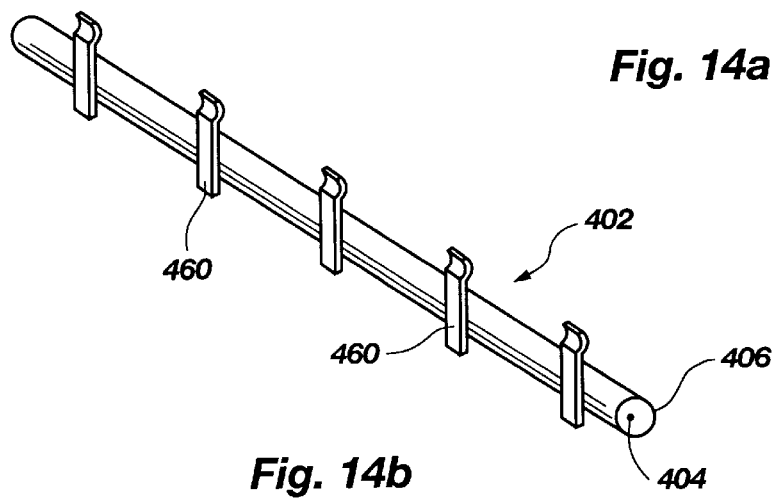
Figure 14C:
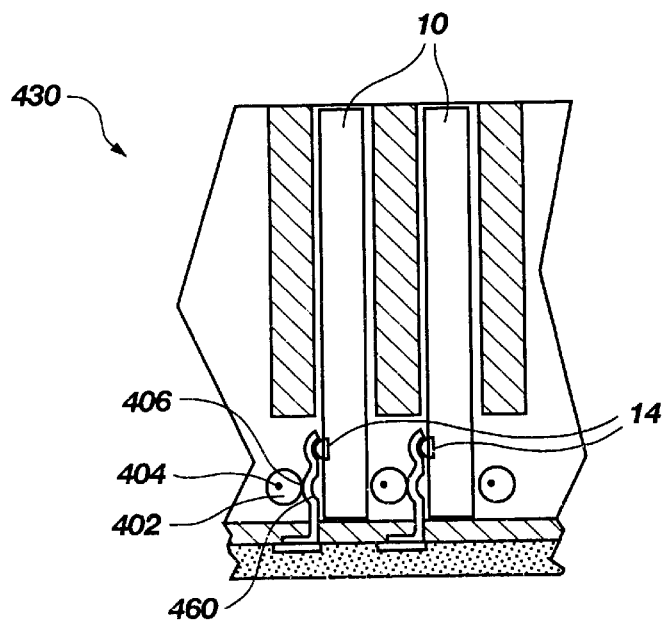
FIG. 14c is a cross-section taken along line 14c—14c of FIG. 14a, showing a socket which includes a plurality of cams.

Referring now to FIGS. 14a through 14c, a third embodiment of a zero insertion force socket is shown, which is referred to as socket 430. Socket 430 includes a cam 402 which, when rotated along an axis 404, actuates intermediate conductive elements 460 between a biased position (FIG. 14a) and an insertion position (FIG. 14b). As shown, cam 402 has a circular cross-section. Thus, in order for cam 402 to actuate intermediate conductive elements 460 between the insertion position and the biased position, axis 404 must be off-center. In variations of cam 402 which have non-circular cross-sections, however, axis 404 may extend centrally through the cam. Cam 402 includes a camming surface 406 which biases against intermediate conductive elements 460 as the cam is rotated to a biased position. When cam 402 is rotated to the insertion position, camming surface 406 rotates away from intermediate conductive elements 460, permitting them to spring back to the insertion position.

Alternatively, cam 402 may be positioned on the opposite side of intermediate conductive elements 460, such that when camming surface 406 biases against the intermediate conductive elements, they are forced away from the bond pads 14 of a semiconductor device 10 that is disposed within socket 430. Rotation of cam 402 in the opposite direction permits intermediate conductive elements 460 to resiliently bias against the bond pads 14 of semiconductor device 10.

In sockets 430 which include a plurality of cams 402, each of the cams may be interconnected, such that they rotate in unison.

Figure 15:
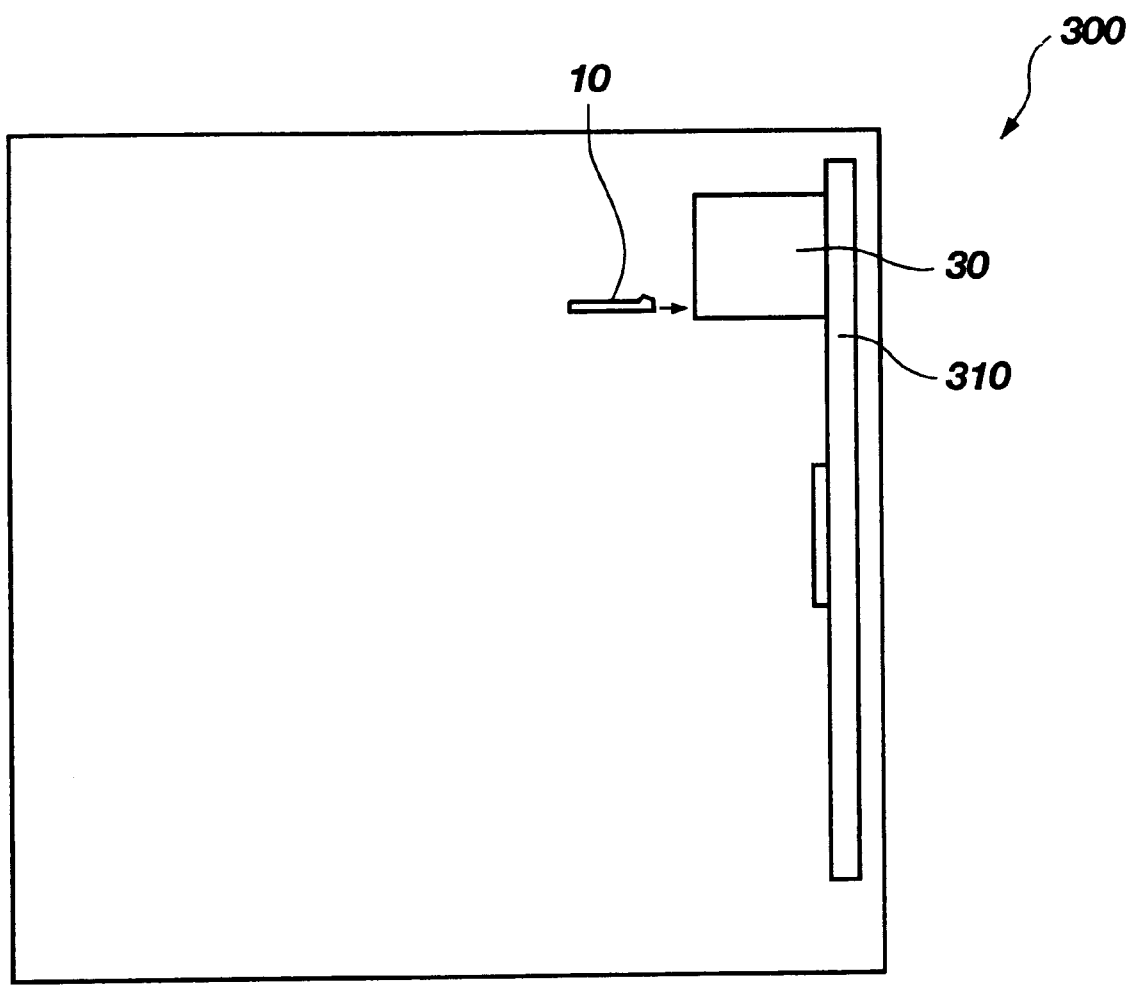
FIG. 15 is a schematic representation of the zero insertion force socket and an interconnected semiconductor device in a computer.

FIG. 15 illustrates a computer 300 including a carrier substrate 310. Socket 30 is secured to carrier substrate 310. Semiconductor device 10 is insertable into socket 30, which establishes an electrical connection between the semiconductor device and carrier substrate 310. Thus, semiconductor device 10 is operatively associated with computer 300.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions and modifications to the invention as disclosed herein which fall within the meaning and scope of the claims are embraced within their scope.

What is claimed is:

1. A socket for orienting a semiconductor die including at least one exposed bond pad substantially perpendicularly relative to a carrier substrate, comprising:
    a body including a receptacle formed therein and adapted to receive the semiconductor die;
    an intermediate conductive element disposed within said receptacle; and
    a member disposed within said receptacle, configured to bias said intermediate
        conductive element against a corresponding exposed bond pad,
        and at least partially defining an elongated slot within which an end of the
        semiconductor die is to be disposed.

2. The socket of claim 1, wherein said member is moveable transversely relative to said body.

3. The socket of claim 1, wherein said member is moveable vertically relative to said body.

4. The socket of claim 1, wherein said member comprises a cam which is rotatable about an axis.

5. The socket of claim 4, wherein said axis is positioned off-center along a length of said cam.

6. The socket of claim 1, further comprising an actuator element operatively connected to said member and configured to control movement of said member relative to said body.

7. The socket of claim 6, wherein said actuator element extends through said body.

8. The socket of claim 1, further comprising a member-position retention component.

9. The socket of claim 1, wherein said intermediate conductive element comprises a leaf spring.

10. The socket of claim 1, wherein said intermediate conductive element has a length of about 1½ mm or less.

11. The socket of claim 1, wherein said intermediate conductive element has a length of about 1 mm or less.

12. The socket of claim 1, wherein said member is configured to bias said intermediate conductive element away from said corresponding exposed bond pad.

13. The socket of claim 1, wherein said member is adapted to at least partially eject the semiconductor die from said receptacle.

14. The socket of claim 1, wherein said intermediate conductive element is fixedly engaged by said member.

15. The socket of claim 1, wherein said intermediate conductive element extends upwardly through said elongated slot.

16. The socket of claim 1, wherein said member is configured to support the semiconductor die.

17. The socket of claim 1, wherein said member includes a camming edge.

18. The socket of claim 17, wherein said camming edge includes at least one tooth comprising a biasing end and an insertion end.

19. The socket of claim 18, wherein said biasing end is configured to facilitate the biasing of said intermediate conductive element against said corresponding exposed bond pad.

20. The socket of claim 18, wherein said insertion end is configured to facilitate the movement of said intermediate conductive element away from said corresponding exposed bond pad.

21. The socket of claim 1, wherein said intermediate conductive element comprises a bond pad contact end and a terminal contact end.

22. The socket of claim 21, wherein said intermediate conductive element further comprises a camming section.

23. The socket of claim 22, further comprising a bias component extending transversely above said member.

24. The socket of claim 23, wherein said bias component abuts said camming section.

25. A vertically mountable semiconductor device assembly, comprising:
    one of a bare semiconductor die and a minimally packaged semiconductor die including an active surface, a bottom edge and at least one exposed bond pad disposed proximate said bottom edge; and
    a socket comprising:
        a body having a receptacle formed therein and configured to receive said one of a bare semiconductor die and a minimally packaged semiconductor die;
        an intermediate conductive element disposed within said receptacle; and
        a member disposed within said receptacle and configured to bias said intermediate conductive element against a corresponding exposed bond pad of said one of a bare semiconductor die and a minimally packaged semiconductor die.

26. The vertically mountable semiconductor device assembly of claim 25, wherein said member is moveable transversely relative to said body.

27. The vertically mountable semiconductor device assembly of claim 25, wherein said member is moveable vertically relative to said body.

28. The vertically mountable semiconductor device assembly of claim 25, wherein said member comprises a cam which is rotatable about an axis thereof.

29. The vertically mountable semiconductor device assembly of claim 28, wherein said axis extends non-centrally along a length of said cam.

30. The vertically mountable semiconductor device assembly of claim 25, further comprising an actuator element operatively connected to said member and configured to control movement of said member relative to said body.

31. The vertically mountable semiconductor device assembly of claim 25, wherein said intermediate conductive element comprises a leaf spring.

32. The vertically mountable semiconductor device assembly of claim 25, wherein said member is configured to bias said intermediate conductive element away from said corresponding exposed bond pad.

33. The vertically mountable semiconductor device assembly of claim 25, wherein said member is adapted to at least partially eject the one of a bare semiconductor die and a minimally packaged semiconductor die from said receptacle.

34. The vertically mountable semiconductor device assembly of claim 25, wherein said intermediate conductive element is fixedly engaged by said member.

35. The vertically mountable semiconductor device assembly of claim 25, wherein said intermediate conductive element comprises a bond pad contact end and a terminal contact end.

36. The vertically mountable semiconductor device assembly of claim 35, wherein said intermediate conductive element further comprises a camming section.

37. The vertically mountable semiconductor device assembly of claim 36, further comprising a bias component extending transversely above said member.

38. The vertically mountable semiconductor device assembly of claim 37, wherein said bias component abuts said camming section.

39. A computer comprising:
  a carrier substrate;
  a socket secured to said carrier substrate and including a body having a downwardly extending receptacle formed through a top thereof, an intermediate conductive element disposed within said receptacle, and a member disposed within said receptacle; and
  one of a bare semiconductor die and a minimally packaged semiconductor die including a bond pad disposed proximate an edge thereof, said edge disposed within said receptacle and said intermediate conductive element biasing against said bond pad.

40. The computer of claim 39, wherein said member is moveable transversely relative to said body.

41. The computer of claim 39, wherein said member is moveable vertically relative to said body.

42. The computer of claim 39, wherein said member comprises a cam that is rotatable about an axis thereof.

43. The computer of claim 42, wherein said axis extends non-centrally along a length of said cam.

44. The computer of claim 39, wherein said intermediate conductive element comprises a leaf spring.

45. The computer of claim 39, wherein said member is configured to bias said intermediate conductive element against said bond pad.

46. The computer of claim 39, wherein said member is configured to bias said intermediate conductive element away from said bond pad.

47. The computer of claim 39, wherein said member is adapted to at least partially eject said one of a bare semiconductor die and a minimally packaged semiconductor die from said receptacle.

48. A method of securing one of a bare semiconductor die and a minimally packaged semiconductor die to a carrier substrate substantially perpendicular thereto, comprising:
  placing a member of a socket into an insertion position;
  inserting the one of a bare semiconductor die and a minimally packaged semiconductor die into a receptacle of said socket; and
  placing said member in a biased position such that said member facilitates biasing of an intermediate conductive element against a bond pad of the one of a bare semiconductor die and a minimally packaged semiconductor die.

49. The method of claim 48, wherein placing said member into an insertion position includes moving said member in a transverse direction relative to a body of said socket.

50. The method of claim 48, wherein placing said member into an insertion position includes moving said member in a vertical direction relative to a body of said socket.

51. The method of claim 48, wherein placing said member into an insertion position includes rotating said member about an axis thereof.

52. The method of claim 48, wherein placing said member into a biased position includes moving said member in a transverse direction relative to a body of said socket.

53. The method of claim 48, wherein placing said member into a biased position includes moving said member in a vertical direction relative to a body of said socket.

54. The method of claim 48, wherein placing said member into a biased position includes rotating said member along an axis thereof.

55. The method of claim 50, further comprising removing the one of a bare semiconductor die and a minimally packaged semiconductor die by replacing said member into an insertion position.

56. The method of claim 57, wherein said removing the one of a bare semiconductor die and a minimally packaged semiconductor die further includes ejecting at least a portion of the one of a bare semiconductor die and a minimally packaged semiconductor die from said socket.

57. The method of claim 48, wherein placing said member into an insertion position facilitates the movement of said intermediate conductive element into an insertion position.

58. The method of claim 48, wherein placing said member into a biased position facilitates the movement of said intermediate conductive element into a biased position.

59. A minimal insertion force socket for orienting a semiconductor device perpendicularly relative to a carrier substrate, comprising:
  a body including a receptacle formed therein and adapted to receive the semiconductor device;
  an intermediate conductive element disposed within said receptacle; and
  a member disposed within said receptacle, configured to bias said intermediate conductive element against a corresponding bond pad of the semiconductor device, and at least partially defining an elongated slot within which an end of the semiconductor device is to be disposed.

60. A vertically mountable semiconductor device assembly, comprising:
  one of a bare semiconductor die and a minimally packaged semiconductor die including a bond pad disposed proximate a bottom edge; and
  a minimal insertion force socket comprising:
    a body having a downwardly extending receptacle formed therein and adapted to receive said one of a bare semiconductor die and a minimally packaged semiconductor die;
    an intermediate conductive element disposed within said body; and
    a member disposed within said receptacle and configured to bias said intermediate conductive element against a corresponding bond pad of said one of a bare semiconductor die and a minimally packaged semiconductor die.

61. A computer comprising:
  a carrier substrate;
  a minimal insertion force socket secured to said carrier substrate and including a body having a receptacle formed therein, an intermediate conductive element disposed within said receptacle, and a member disposed within said receptacle; and one of a bare semiconductor die and a minimally packaged semiconductor die including a bond pad disposed proximate an edge thereof, said edge disposed within said receptacle and said intermediate conductive element biasing against said bond pad.

62. A method of securing one of a bare semiconductor die and a minimally packaged semiconductor die to a carrier substrate substantially perpendicular thereto, comprising:

placing a member of a minimal insertion force socket into an insertion position;

inserting the one of a bare semiconductor die and a minimally packaged semiconductor die into a receptacle of said minimal insertion force socket; and placing said member in a biased position such that said member facilitates biasing of an intermediate conductive element against a bond pad of the one of a bare semiconductor die and a minimally packaged semiconductor die.

* * * * *

UNITED STATES PATENT AND TRADEMARK OFFICE
CERTIFICATE OF CORRECTION

PATENT NO. : 6,088,237
DATED : July 11, 2000
INVENTOR(S) : Farnworth et al.

It is certified that error appears in the above-identified patent and that said Letters Patent is hereby corrected as shown below:

Drawings
Fig. 6b, add numeral -- 14 -- and reference line therefor;
Fig. 11, change "51" to -- 151 -- and add numeral -- 138 -- and reference line therefor; and
Fig. 12, change "51" to -- 151" --.

Column 3,
Line 3, delete "," after "components" and after "and" change ";" to -- , --;
Line 5, delete "," after "device";

Column 4,
Line 64, after "etc." insert -- , --;

Column 5,
Line 2, after "etc." insert -- , --;
Line 3, after "etc." insert -- , --;
Line 6, after "etc." insert -- , --;
Line 12, after "etc." insert -- , --;
Line 15, after "etc." insert -- , --;
Line 27, after "etc." insert -- , --;
Line 28, after "etc." insert -- , --;

Column 6,
Line 1, delete "and 50";
Line 40, change "and" to -- an --;
Line 67, change "(i.e," to -- (i.e., --;

Column 7,
Line 11-12, change "a biasing end 53" to -- an insertion end 53 -- and "an insertion end 54." to -- a biasing end 54. --;
Line 12, change "Insertion end 54" to -- Biasing end 54 --;
Line 13, change "biasing end 53." to -- insertion end 53. --;
Line 16, change "insertion end 54" to -- biasing end 54 -- and change "biasing end 53" to -- insertion end 53 --;
Line 22, after "is" insert -- , -- and after "therefore" insert -- , --;
Line 24, delete "and 41'";
Line 25, delete "and 42'";
Line 60, after "and" insert -- , -- and after "therefore" insert -- , --;

UNITED STATES PATENT AND TRADEMARK OFFICE
CERTIFICATE OF CORRECTION

PATENT NO. : 6,088,237
DATED : July 11, 2000
INVENTOR(S) : Farnworth et al.

It is certified that error appears in the above-identified patent and that said Letters Patent is hereby corrected as shown below:

Column 9,
Line 18, change "clement" to -- element --;
Line 54, after "is" insert -- , -- and after "therefore" insert -- , --;

Column 10,
Line 34, after "and" insert -- , -- and after "therefore" insert -- , --; and
Line 39, after "position" and before "." insert -- (not shown) --.

Claim 1, column 11,
Line 35, continue text without hard return after "intermediate";
Line 37, continue text without hard return after "pad,";
Line 39, continue text without hard return after "the,";

Claim 20, column 12,
Line 18, delete "the";

Claim 49, column 14,
Line 1, after "wherein" insert -- said --;
Line 2, delete "an" and insert -- said -- therefor;

Claim 50, column 14,
Line 4, after "wherein" insert -- said --;
Line 5, delete "an" and insert -- said -- therefor;

Claim 51, column 14,
Line 7, after "wherein" insert -- said --;
Line 8, delete "an" and insert -- said -- therefor;

Claim 52, column 14,
Line 10, after "wherein" insert -- said --;
Line 11, delete "an" and insert -- said -- therefor;

Claim 53, column 14,
Line 13, after "wherein" insert -- said --;
Line 14, delete "an" and insert -- said -- therefor;

Claim 54, column 14,
Line 16, after "wherein" insert -- said --;
Line 17, delete "an" and insert -- said -- therefor;

UNITED STATES PATENT AND TRADEMARK OFFICE
CERTIFICATE OF CORRECTION

PATENT NO.   : 6,088,237
DATED        : July 11, 2000
INVENTOR(S)  : Farnworth et al.

It is certified that error appears in the above-identified patent and that said Letters Patent is hereby corrected as shown below:

<u>Claim 55, column 14,</u>
Line 19, change "50" to -- 48 --;

<u>Claim 56, column 14,</u>
Line 23, change "57" to -- 55 --;

<u>Claim 57, column 14,</u>
Line 28, after "wherein" insert -- said --;
Line 29, delete "an" and insert -- said -- therefor and delete "the";

<u>Claim 58, column 14,</u>
Line 31, after "wherein" insert -- said --;
Line 32, delete "a" and insert -- said -- therefor and delete "the"; and <u>Claim 59, column 14,</u>
Line 44, start line with "and" as part of the continued indented paragraph.

Signed and Sealed this

Twenty-third Day of October, 2001

Attest:

*Attesting Officer*

NICHOLAS P. GODICI
*Acting Director of the United States Patent and Trademark Office*